United States Patent [19]

Brower

[11] 4,170,034
[45] Oct. 2, 1979

[54] MULTILAMP PHOTOFLASH UNIT WITH MORE RELIABLE CIRCUIT ARRANGEMENT

[75] Inventor: Boyd G. Brower, Williamsport, Pa.

[73] Assignee: GTE Sylvania Incorporated, Stamford, Conn.

[21] Appl. No.: 860,759

[22] Filed: Dec. 15, 1977

[51] Int. Cl.² .............................................. G03B 15/02
[52] U.S. Cl. ........................................ 362/12; 362/13; 362/14
[58] Field of Search .............................. 362/12, 13, 14

[56] References Cited

U.S. PATENT DOCUMENTS

| | | | |
|---|---|---|---|
| 3,935,442 | 1/1976 | Hanson | 362/14 |
| 3,937,946 | 2/1976 | Weber | 362/14 |
| 4,017,728 | 4/1977 | Audesse et al. | 362/13 |

Primary Examiner—Brooks H. Hunt
Attorney, Agent, or Firm—Edward J. Coleman

[57] ABSTRACT

In a compact multilamp photoflash arrangement for providing more lamps in a given volume, a reliable sequencing circuit of normally open and normally closed switches is provided by employing a series-parallel combination of the normally open switches which minimizes resistance buildup and circuit discontinuity problems.

6 Claims, 4 Drawing Figures

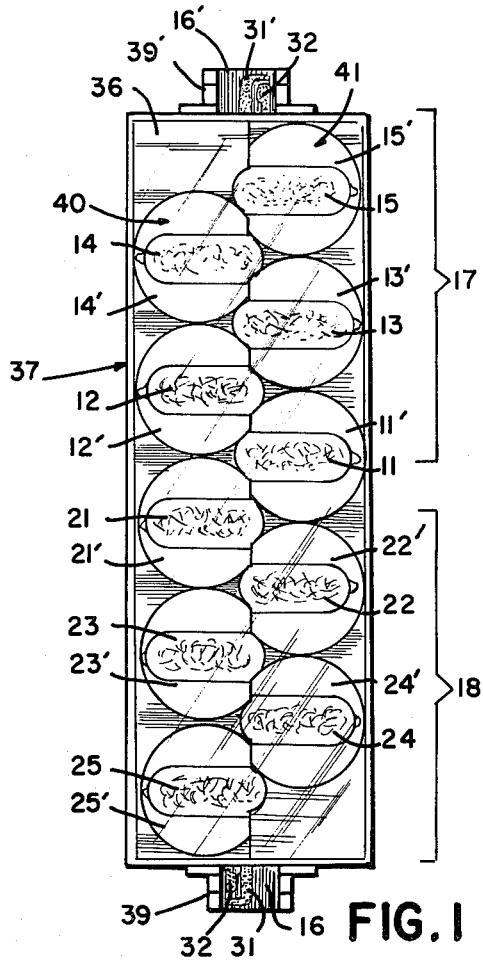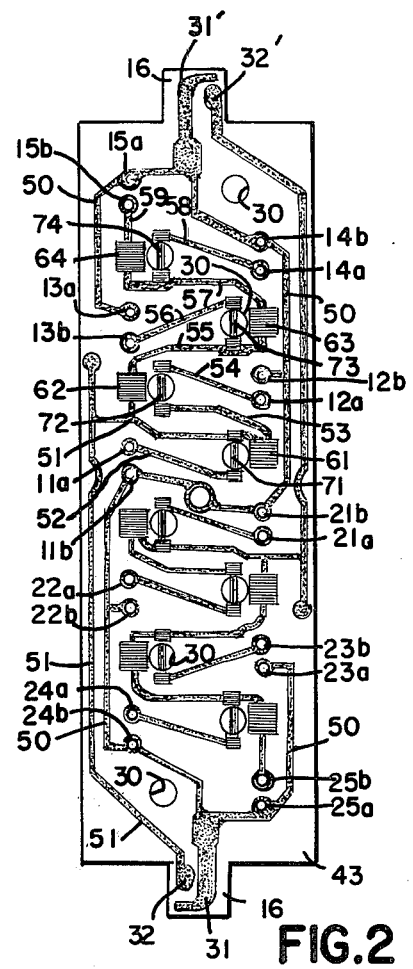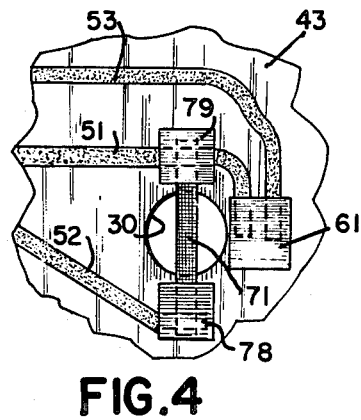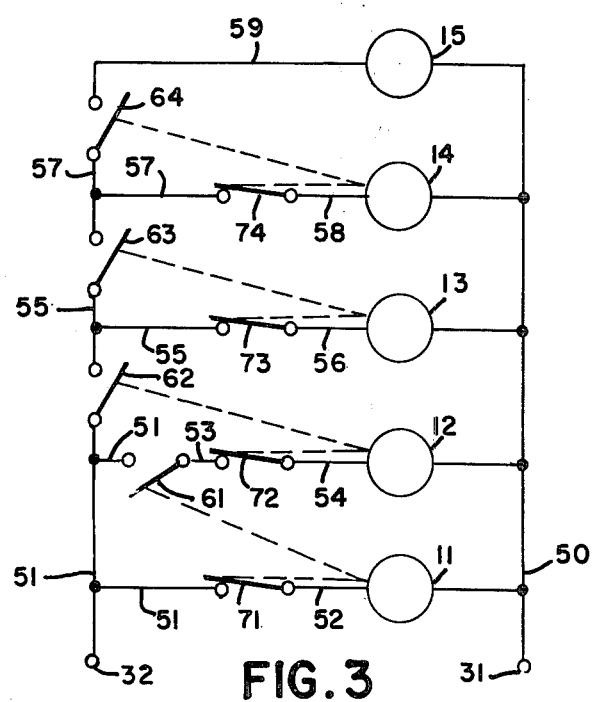

MULTILAMP PHOTOFLASH UNIT WITH MORE RELIABLE CIRCUIT ARRANGEMENT

CROSS-REFERENCES TO RELATED APPLICATIONS

Ser. No. 614,108, now U.S. Pat. No. 4,017,728, filed Sept. 17, 1975, Emery G. Audesse et al, "Multilamp Photoflash Unit Having Radiant-Energy-Activated Quick-Disconnect Switch", assigned the same as this invention.

Ser. No. 785,987, filed Apr. 8, 1977, Boyd G. Brower, "Multilamp Photoflash Unit and Method of Making Circuit Board Therefor", assigned the same as this invention.

Ser. No. 840,497, filed Oct. 7, 1977, Emery G. Audesse et al, "Multilamp Photoflash Unit", assigned the same as this invention.

Ser. No. 840,498, filed Oct. 7, 1977, Donald E. Armstrong, "Multilamp Photoflash Unit", assigned the same as this invention.

BACKGROUND OF THE INVENTION

The present invention relates to multilamp photoflash units and, more particularly, to a reliable sequencing circuit for compact multilamp photoflash units.

Numerous multilamp arrangements with various types of sequencing circuits have been described in the prior art; particularly in the past few years. A currently marketed photoflash unit (described in U.S. Pat. Nos. 3,894,226, 3,912,442; 3,935,442; 3,937,946; 3,941,992; 3,952,320 and 4,017,728 and referred to as a flip flash) employs high-voltage type lamps adapted to be ignited sequentially by successively applied high-voltage pulses from a source such as a camera-shutter-actuated piezoelectric element. The flip flash unit comprises an elongated planar array of eight high-voltage type flashlamps mounted on a printed circuit board with an array of respectively associated reflectors disposed therebetween. The lamps are arranged in two groups of four disposed on the upper and lower halves respectively of the rectangular-shaped circuit board. A set of terminal contacts at the lower end of the unit is provided for activation of the upper group of lamps, while a set of terminal contacts at the top of the unit is operatively associated with the lower group of four lamps. The application of successive high-voltage pulses (e.g., 500 to 4,000 volts from, say, a piezoelectric source controlled by the shutter of a camera in which the array is inserted) to the terminal contacts at the lower end of the unit causes the four lamps at the upper half of the array to be sequentially ignited. The array may then be turned end for end and again inserted into the camera in order to flash the remaining four lamps. In this manner, one group of lamps (or half of the array) functions as a flash extender for the other group of lamps, so that only the group of lamps relatively farther from the camera lens axis can be flashed. The purpose of such an arrangement is to position the "active" group of flashlamps farther above the camera lens in order to reduce the possibility of a "red-eye" effect that causes the pupils of a person's eyes to appear red or pink in flash pictures taken when the flashlamp is close to the camera lens.

The flip flash circuit board comprises an insulating sheet of plastic having a pattern of conductive circuit traces, including the terminal contacts, on one side. The flashlamp leads are electrically connected to these circuit traces by means of eyelets secured to the circuit board and crimped to the lead wires. The circuitry on the board includes six printed, normally open, connect switches that chemically change from a high to lower resistance so as to become electrically conducting after exposure to the radiant heat energy from an ignited flashlamp operatively associated therewith. The purpose of these switches is to provide lamp sequencing and one-at-a-time flashing. The four lamps of each group are arranged in a parallel circuit with three of the four lamps being connected in series with their respective thermal connect switches. Initially, only the first of the group of four lamps is connected directly to the voltage pulse source. When this first group flashes, it causes its associated thermal connect switch (which is series connected with the next or second lamp) to become permanently conductive. Because of this action, the second lamp of the group of four is connected to the pulse source. This sequence of events is repeated until all four lamps have been flashed. A problem with such a circuit and other similar arrangements is that if one lamp short-circuits internally upon flashing, the successive parallel lamps of that group of four cannot be flashed; i.e., the remaining lamps are shorted out.

It has been found that this problem can be eliminated by the use of a radiant-energy-activated switch that is normally conducting and which becomes nonconducting subsequent to exposure of the actinic output of the flashlamp associated therewith. This normally closed disconnect switch is used in series with each of the lamps, except the last lamp, in a sequentially flashing parallel group of high voltage flashlamps. It may be used, if desired, in addition to the printed connect switches, which is normally open and which close upon actinic exposure. Hence, the modes of action of these two types of switches are opposite from one another—the disconnect switch interrupts the igniting circuit of the lamp in series with it upon firing of that lamp, while the thermal connect switch establishes the igniting circuit for the next lamp upon being activated.

A particularly fast acting disconnect switch is described in the aforementioned U.S. Pat. No. 4,017,728 of Audesse et al, wherein the switch element comprises a piece of electrically conductive, heat shrinkable, polymeric material which is positioned so as to be in operative relationship with the radiant output from the series connected lamp during the ignition thereof. Each switch element is attached at both ends to the lamp igniting circuit with the midportion of the element being spatially suspended to avoid contact with heat absorbing surfaces. Upon ignition of its associated lamp, the midportion of the switch element rapidly shrinks and separates in response to the radiant output of the lamp, thereby providing a quick-acting, reliable open circuit to high voltages.

The overall construction of the flip flash unit comprises front and back plastic housing members with interlocking means for providing a unitary structure. The front housing member is a rectangular concavity and the back housing is substantially flat. Sandwiched between the front and back housing members, in the order named, are the flashlamps, a unitary member, preferably of aluminum-coated plastic, shaped to provide the eight individual reflectors of the array, an insulating sheet, a printed circuit board, and an indicia sheet, which is provided with information, trademarks, and flash indicators located behind the respective lamps and which change color due to heat and/or light radiation from a flashing lamp, thus indicating at a glance which of the lamps have been flashed and not flashed.

The above-referenced copending application Ser. No. 840,497, Audesse et al, filed Oct. 7, 1977, describes an improved multilamp photoflash unit which more efficiently utilizes a given housing volume and thereby reduces the cost of the unit per flashlamp contained therein. More specifically, a compact lamp arrangement is provided whereby additional lamps are contained in a given volume while maintaining light output performance requirements. In a particular embodiment described, ten lamps are provided in a housing having the same dimensions as the above-discussed eight-lamp flip flash units. This greater compactness is provided by arranging the planar array of lamps in two parallel columns with the tubular envelopes horizontally disposed and with the lamps of one column staggered with respect to the other such that the bases are interdigitated. A pair of reflector panels are aligned with the two columns of lamps and arranged to overlie the lamp lead-in wires and bases.

As may well be appreciated, the above-described compact ten-lamp array imposes a significant challenge with respect to the design and layout of a suitable sequencing circuit on the asocciated printed circuit board. Previous lamp sequencing circuits have used either series or parallel "normally open" (N/O) connect switches and/or parallel "normally closed" (N/C) disconnect switches. For example, see the above-referenced U.S. Pat. No. 4,017,728 (parallel switches) and Ser. No. 840,498, filed Oct. 7, 1977 (series switches). It will be noted that in a given circuit all of each type of switch is either in series or in parallel.

The increase in the number of lamps from eight to ten requires that additional N/C and N/O switches be used. This increase, the position of the lamps, and the desired sequence of flashing forces the use of series N/O switches if the previous switch design is employed. The additive resistance of series N/O switches, however, can cause lamp failures, especially when one switch has a discontinuity. An additional switch (or switches) in series increases the likelihood of this failure mode. An even more significant problem created by the close tolerances is a possible discontinuity in the circuit itself caused by the inherent variation in the placement of the N/C switch. If the first N/C switch of either end of the array is slightly off center, it may project beyond the conductive circuit run. The production process slides the circuit boards across each other and, thus, can wipe the circuit paste off the top of the N/C switches. This can cause an open circuit which acts as a spark gap. It has been found that the lamp immediately following a spark gap will flash, but that each succeeding lamp is more likely to fail due to increasing circuit resistance.

SUMMARY OF THE INVENTION

Accordingly, it is an object of the present invention to provide an improved multilamp photoflash unit which more efficiently utilizes a given housing volume yet provides reliable flash sequencing.

A principal object of the invention is to provide a more reliable sequencing circuit for a compact multilamp photoflash unit.

These and other objects, advantages and features are attained, in accordance with the invention, by providing a multilamp sequencing circuit combination in which the first normally open connect switch is placed in parallel with all of the other normally open switches, which are series connected. In this manner, once the second normally open switch has been activated, the resistance of the first normally open switch is bypassed, along with any potential discontinuity caused by the first normally closed switch, if N/C switches are employed. Accordingly, in a compact photoflash unit containing additional lamps, a largely series arrangement of N/O switches is retained, consistent with spatial constraints, in combination with a parallel N/O switch to minimize the two problems of resistance build up and circuit discontinuities. Hence, the probability of failure is decreased and reliability is increased.

BRIEF DESCRIPTION OF THE DRAWINGS

This invention will be more fully described hereinafter in conjunction with the accompanying drawings, in which:

FIG. 1 is a front elevation of a multilamp photoflash unit in which the present invention is employed;

FIG. 2 is a front elevation of a printed circuit board used in the unit of FIG. 1, the circuit board including a switching circuit arrangement in accordance with the invention;

FIG. 3 is a circuit diagram in accordance with the invention for the top half of the photoflash unit of FIGS. 1 and 2; and FIG. 4 is an enlarged fragmentary detail view of a portion of the circuit board of FIG. 2 showing the switching arrangement associated with one of the lamps.

DESCRIPTION OF PREFERRED EMBODIMENT

FIG. 1 illustrates a multilamp photoflash unit of the type described in the aforementioned copending application Ser. No. 840,497 Audesse et al. This unit is similar in general operation to that described in the aforementioned U.S. Pat. No. 4,017,728, except that the construction has been modified to include additional lamps in a housing having the same outer dimensions. Whereas the unit described in the above-mentioned patent included a planar array of eight high voltage type flashlamps (two groups of four) with associated reflector cavities provided in a single reflector member, the present unit comprises a planar array of ten flashlamps 11–15 and 21–25 mounted on a printed circuit board 43 (see FIG. 2) with an array of respectively associated reflector cavities 11'–15' and 21'–25' disposed therebetween. The lamps are horizontally disposed and mounted in two parallel columns, with the lamps of one column staggered relative to the lamps of the other column. Each of the lamps has a pair of lead-in wires (not shown) connected to the printed circuitry on board 43 by respective eyelets 11a and 11b, etc. The column of the lamps 15, 13, 11, 22 and 24 are positioned with their respective bases interdigitated with the bases of the adjacent column comprising lamps 14, 12, 21, 23 and 25, the bases of one column thereby facing the adjacent column. The reflector cavities are provided on a pair of strip-like panels 40 and 41 which are conveniently separable for assembly purposes. The array is provided with a plug-in connector tab 16 at the lower end thereof which is adapted to fit into a camera or flash adaptor. A second plug-in connector tab 16' is provided at the top end of the unit, whereby the array is adapted to be attached to the camera socket in either of two orientations, i.e., with either the tab 16 or the tab 16' plugged into the socket. The lamps are arranged in two groups of five disposed on the upper and lower halves, respectively, of the elongated, rectangular-shaped array. Upper group 17 comprises lamps 11-15, and lower group 18 includes lamps 21-25; the reflector cavities 11', etc. are disposed behind the respective lamps so that as each lamp is flashed, light is projected forwardly of the array. The lamps are arranged and connected so that when the array is connected to a camera by the connector tab 16 only the upper group 17 of lamps will be flashed, and when the array is turned end for end and connected to the camera by the other connector tab 16', only the then upper group 18 of lamps will be flashed. By this arrangement, only lamps relatively far from the camera lens axis are flashable, thus reducing the undesirable red-eye effect.

The construction of the array comprises front and back housing members 36 and 37 (only the outer periphery of the back housing member is visible in FIG. 1), which preferably are made of plastic and are provided with interlocking members (not shown) which can be molded integrally with the housing members and which lock the housing members together in final assembly to form a unitary flash array structure. In the preferred embodiment, the front housing member 36 is a rectangular concavity and the back housing member 37 is substantially flat and includes integral extensions 39 and 39' at the ends thereof which partly surround and protect the connector tabs 16 and 16' and also function to facilitate mechanical attachment to the camera socket. Sandwiched between the front and back housing members 36 and 37, in the order named, are the flashlamps 11, etc., the pair of adjacent strip-like reflector panels 40 and 41 (preferably each being an aluminum-coated plastic molding) shaped to provide the individual reflector cavities 11' etc., a transparent electrically insulating sheet (not shown), the printed circuit board 43 provided with integral connector tabs 16 and 16', and an indicia sheet (not shown) which may be provided with information and trademarks, and other indicia such as flash indicators located behind the respective lamps and which change color due to heat and/or light radiation from a flashing lamp, thus indicating at a glance which of the lamps have been flashed and not flashed.

Window means, such as openings (not shown), are provided in each of the reflector cavities 11', etc., behind the lamp aligned therewith. The circuit board 43 is provided with corresponding openings 30 to facilitate radiation from the flash lamps reaching the flash indicators. The rear housing member 37 is transparent (either of clear material or provided with window openings) to permit viewing of the indicia on the indicia sheet. The front housing member 36 is transparent, at least in front of the lamps 11, etc., to permit light from the flashing lamps to emerge forwardly of the array and may be tinted to alter the color of the light from the flashlamps.

The height and width of the rectangular array are substantially greater than its thickness, and the height and width of the reflector panels 40, 41, the insulating sheet, and circuit board 43 are substantially the same as the interior height and width of the housing member 36 to facilitate holding the parts in place.

Referring to both FIGS. 1 and 2, the tab 16, which is integral with the circuit board 43, is provided with a pair of electrical terminals 31 and 32, and similarly the tab 16' is provided with a pair of terminals 31' and 32', for contacting terminals of a camera socket for applying firing voltage pulses to the array. The terminals 31 and 31' are shown as having a J-shaped configuration for temporarily shorting the socket terminals, while the array is being plugged in, to discharge any residual voltage charge in the firing pulse source and also to reduce the likelihood of lamps being accidentally flashed by electrostatic voltage when the array is handled.

Referring to FIG. 2, the circuit board 43 has a "printed circuit" thereon for causing sequential flashing of the lamps by firing voltage pulses applied to the terminals 31, 32, 31', 32'. In accordance with the present invention the printed circuit is uniquely modified from that described in the aforementioned U.S. Pat. Nos. 3,894,226 or 4,017,728 in order to extend the circuitry in a reliable operating manner to accommodate an additional lamp in each half of the printed circuit board. The top and bottom halves of the printed circuitry preferably are reverse mirror images of each other. The lead wires (not shown) of the lamps 11 etc. (FIG. 1) may be attached to the circuit board 43 in various ways such as by means of the metal eyelets 11a, 11b, etc., placed through openings in the board. The lead wires underlie the reflector panels and pass into or through the respective pairs of eyelets 11a, 11b, etc. The ends of the eyelets are crimped or bent to hold the lead wires and made electrical contact thereto and also to hold the eyelets in place with their heads in electrical contact with the circuit of the circuit board.

The circuit combination according to the invention will now be described with reference to the circuit diagram of FIG. 3 and the preferred physical embodiment thereof in the circuit board of FIG. 2. Firstly, it will be noted that the circuit located on the upper half of the circuit board of FIG. 2 and activated by the pair of input terminals 31 and 32 includes five lamps 11-15 arranged in parallel across the input terminals and four normally closed (N/C) radiant-energy-activated disconnect switches 71, 72, 73, and 74 each connected in series with a respective one of the lamps 11-14. Each N/C disconnect switch is responsive to the flashing of the lamp with which it is series-connected to form an open circuit. The circuit also includes four normally open (N/O) radiant-energy-activated connect switches 61, 62, 63, and 64 for providing sequential flashing of the lamps 11-15 in response to firing pulses successively applied to the input terminals 31 and 32. Each N/O connect switch is responsive to the flashing of an associated lamp (indicated by a dashed line) to form a closed circuit condition. One terminal (lead-in wire) of each of the lamps 11-15 is connected in common by means of an electrical "ground" circuit run 50 to input terminal 31. The "ground" circuit run 50 includes the terminals 31 and 31' and makes contact with one of the connector eyelets for each of the lamps.

In accordance with the circuit combination of the invention, the first lamp to be fired, namely, lamp 11, is connected directly across the input terminals 31 and 32 via the N/C disconnect switch 71. The second through fourth N/O connect switches, namely, 62, 63 and 64, are series connected in that order with lamp 15, which is the fifth and last lamp to be fired, across the input terminals 31 and 32. Further, the third lamp to be fired (lamp 13) is series connected with N/O switch 62, and the fourth lamp to be fired (lamp 14) is connected in series with N/O switch 63. As will be apparent from the printed circuit layout in FIG. 2, which will be discussed in more detail hereinafter, this series connection of as many N/O switches as possible is necessary due to the spatial constraints imposed by the illustrated compact packaging, which accommodates two additional lamps in a container having outer dimensions which previously accommodated only eight lamps.

In order to limit the resistance build-up caused by additional series N/O switches, and any possible circuit discontinuity caused by misplacement of the first N/C switch 71, the first N/O switch to be activated (switch 61) is series-connected with the second lamp to be fired (lamp 12) across the input terminals 31 and 32 but parallel-connected with the above-mentioned series combination of N/O switches 62–64 and lamp 15.

Terminal 32 is part of a conductor run 51 that terminates at three different switches, namely, the N/C disconnect switch 71, the N/O connect switch 61, and the N/O connect switch 62. The other side of switch 71 is connected to lamp 11 via circuit run 52 and eyelet 11a. Circuit run 53 connects switches 61 and 72, and circuit run 54 connects the other side of switch 72 to lamp 12 via eyelet 12a. A circuit run 55 interconnects switches 62, 73 and 63, while the other side of switch 73 is connected to lamp 13 via circuit run 56 and eyelet 13b. Switches 63, 74 and 64 are interconnected by a circuit run 57, while the other side of switch 74 is connected to lamp 14 via circuit run 58 and eyelet 14a. Finally, a circuit run 59 connects the other side of switch 64 to lamp 15 via eyelet 15b.

The radiant-energy-activated N/O connect switches 61–64 are in contact with and bridge across the circuit runs that are connected to them. FIG. 4 illustrates this for switch 61. The material for the connect switch is selected to be of the type initially having an open circuit or high resistance, the resistance thereof becoming nearly zero or a lower value when the material receives radiation in the form of heat and/or light from a respective adjacent lamp, upon the lamp being flashed. For this purpose, each of the connect switches is respectively positioned behind and near to an associated flashlamp, as indicated by the dashed lines in FIG. 3. To facilitate radiation transfer from the flashlamp to its corresponding N/O connect switch, each of the reflectors includes a window means, such as an opening (not shown), in alignment with the respective radiation connect switches. Each of these connect switches has a composition which will be described hereinafter, and upon receiving heat and/or light radiation from the adjacent lamp when it is flashed, changes from an open circuit or high resistance to a closed circuit or lower resistance between its switch terminals on the circuit board.

As described in the previously referenced U.S. Pat. No. 4,017,728 Audesse et al, each of the N/C disconnect switches 71–74 comprises a length of electrically conductive, heat shrinkable, polymeric material which is attached to the circuit board at both ends, with its midportions spatially suspended to avoid contact with the heat absorbing surfaces of the circuit board. This arrangement maximizes the speed with which the shrinking and separation of the midportion of the switch element occurs upon its being heated by the radiant output of an ignited flashlamp. More specifically, referring to the embodiment illustrated in FIG. 4, the disconnect switch comprises a thin strip 71 of plastic, preferably fabricated from mono- or biaxially oriented polyethylene, polypropylene, polystyrene, polyester or nylon. The polymeric material itself may be rendered electrically conductive by esters such as carbons, or it may be rendered surface conductive by deposition of conductive layers thereon. Such conductive surface layers may be obtained, e.g., by a vacuum metallization, electrolysis plating, printing, or coating using conductive inks, or by silk screening or by otherwise applying a conductive path across the switch defined by the polymeric film. The performance of highly reflective materials, such as aluminized polypropylene, can be enhanced by applying a coating of light-absorbing ink or other similar material onto the surface facing the flashlamp. The piece of switch material may be self-adhesive, such as a tape, and pressure applied to attach both ends of the strip 71 to the circuit board as illustrated. Each attached strip is located so that it bridges a respective one of the circuit board apertures 30 so as to provide the desired spatial suspension of the midportion of the strip. For silk screened circuitry, it is advantageous to carry the circuit pattern over the ends of the preapplied switch strip. In this manner, the circuit material helps to anchor the switch ends to the circuit board substrate, in addition to providing electrical connection of both ends of the switch strip into the printed circuit.

By locating the disconnect switch strips across the aperatures 30, each element of heat shrinkable material is positioned so as to be in operative relationship with the radiant output of its respective lamp via an aperture (not shown) in the back of the reflector. Hence, upon ignition of a given flashlamp, the switch material is radiantly heated so that it weakens and softens as well as shrinks. As separation occurs near the center of each piece, the two separate ends shrink back away from each other so as to give an open circuit that will reliably withstand several thousand volts without leakage. Since a lamp after flashing is removed electrically from the circuit, the subsequent lamps are unaffected by short circuiting or residual conductivity in previously flashed lamps.

As described in the referenced copending application Ser. No. 785,987, Brower, the high resistance material employed in providing the N/O connect switches 61–64 is also disposed on and about each of the ends of the N/C disconnect switches. For example, as illustrated in FIG. 4, the disconnect strip switch 71 is attached to circuit board 43 so as to extend laterally across aperture 30 with respect to the lamp. Conductive trace 53 extends to provide one contact for a connect switch 61, while a trace 51 provides the other connect switch contact. In addition, trace 51 is carried over one end of a strip 71. A trace 52 contacts the other end of the strip 71. In this instance, patches 78 and 79 of high resistance material cover each end of the conductive strip 71 to shield the circuit run carry-over regions from abrasion during the manufacturing process and further secure the strip to the circuit board. In addition to this mechanical protection, the high resistance patches 78 and 79 provide insulation to prevent shorting or spark-over between the strip ends and the nearby circuit traces 53 and 50 (also see FIG. 2). In this position, the patches 78 and 79 are masked by the reflector during flashing and thereby retain their insulating properties after lamp flashing. Although there are other methods of insulating the disconnect switch ends, such as by a coat of insulating resin, use of the connect switch paste eliminates a production process, as will be made clear hereinafter, by combining the switch-depositing step and an insulating step.

As has been explained, the lower portion of the circuit board contains a substantially reverse mirror image of the same circuitry shown in the upper part of the circuit board, and therefore will not be described in detail. It will be noted that the circuit runs from the plugged in terminals 31 and 32 at the lower part of the circuit board extend upwardly so as to activate the circuitry in the upper half of the circuit board. Similarly when the unit is turned around and tab 16′ is plugged into a socket, the circuit board terminals 31′ and 32′ will be connected to activate the lamps which then will be in the upper half of the circuit board, and hence in the upper half of the flash unit. This accomplishes the desirable characteristic whereby only the group of lamps relatively farthest away from the lens axis will be flashed thereby reducing the possibility of the phenomena known as "red-eye".

A preferred method for making the printed circuit board for the described photoflash unit comprises the following steps. First, the conductive strips 71–74 of fusible material are mounted at the denoted selected locations on a nonconductive substrate, such as a thin sheet of polystyrene, having the apertures illustrated in FIG. 2. Next a conductive ink, such as silver flakes mixed in a binder, is screen printed onto the nonconductive substrate in the illustrated desired pattern of circuit traces with portions of the conductive circuit traces carried over the attached ends of the strips 71–74, as illustrated, for example, in FIG. 4. The printed ink is then cured, for example, by air drying or passing the printed circuit boards through a low temperature drying oven. The ink printing of all circuit traces can be a single operational step. Next, a paste of high resistance material is screen printed onto the ink-printed nonconductive substrate in a desired pattern of patches. A first portion of the patch pattern is disposed to cover the attached ends of strip 71–74 in the portions of circuit traces carried thereover; this portion of the patch pattern comprises areas such as those denoted 78 and 79 in FIG. 4. A second portion of the patch pattern is disposed to bridge selected portions of the circuit traces to thereby provide connect switches 61–64 (on each half of the board). The high resistance paste is then cured by air or oven drying. Hence both the connect switches and protective insulating patches are screen printed on the substrate in a single operational step.

An alternate method of making the circuit board comprises first printing the ink on the nonconductive substrate, curing the ink, and then mounting the strips 71–74 by attaching both ends to respective spaced apart portions of the circuit traces. For example, the strips 71–74 may have a conductive adhesive material on the side attached to the circuit traces. The high resistance paste pattern is then printed on the board in a single operational step as previously described.

The high resistance paste used to make switches 61–64 may comprise a known mixture of silver compound and a binder. According to a preferred embodiment, however, the material comprises a silver compound such as silver carbonate, a binder such as polystyrene resin, and a protective oxidizing agent such as barium chromate, as described in the copending application Ser. No 733,599, John W. Shaffer, filed Oct. 18, 1976, and assigned to the present assignee. For example, the dried composition of a specific silk screenable high resistance material such as has been employed for such a patch pattern comprises 98.75% silver carbonate, 0.25% barium chromate, and 1.0% polystyrene resin as a binder. This mixture is made into a paste by ball milling in a suitable solvent such as butyl cellosolve acetate. The solids content may be adjusted to suit the method of switch application. For silk-screening over a circuit board, it is preferred to adjust the solids content to about 74%.

The circuit on the circuit board 43 functions as follows. Assuming that none of the five lamps in the upper half of the unit have been flashed, upon occurrence of the first firing pulse applied across the terminals 31 and 32, this pulse will be directly applied to the lead-in wires of the first-connected flashlamp 11, whereupon the lamp 11 flashes and becomes an open circuit between its lead-in wires. Heat and/or light radiation from the flashing first lamp 11 is operative via its respective reflector aperature to activate the N/C disconnect switch 71 and the N/O connect switch 61. As a result, the normally closed disconnect switch 71 is operative in response to the radiation from the lamp to rapidly provide a reliable open circuit to high voltages and thus electrically remove lamp 11 from the circuit, whereby the subsequent lamps 12-15 are unaffected by short circuiting or residual conductivity in lamp 11. The radiation causes the normally open connect switch 61 to become a closed circuit (or a low value of resistance), thereby connecting the circuit board terminal 32 electrically to the second lamp 12 via the normally closed disconnect switch 72. By the time this occurs, the firing pulse has diminished to a value insufficient to cause the second lamp 12 to flash. When the next firing pulse occurs, it is applied to the lead-in wires of the second lamp 12 via the now closed connect switch 61 and disconnect switch 72, whereupon the second lamp 12 flashes, thereby causing disconnect switch 72 to rapidly provide an open circuit and causing connect switch 62 to assume near zero or low resistance. Once switch 62 has been activated, the resistance of the N/O connect switch 61 is bypassed along with any potential discontinuity caused by the N/C disconnect switch 71. When the next firing pulse occurs, it is applied via now closed connect switch 62 and disconnect switch 73 to the third lamp 13, thereby firing that lamp, whereupon the radiation from lamp 13 activates disconnect switch 73 to rapidly provide an open circuit and causes connect switch 63 to become essentially a closed circuit across its terminals. The next firing pulse will be applied, via now closed connect switch 63 and disconnect switch 74 to the lead-in wires of the fourth flashlamp 14, thereupon causing the lamp to flash. The radiation from lamp 14 activates the disconnect switch 74 to rapidly provide an open circuit and causes connect switches 64 to become essentially a closed circuit across its terminals. Thus, the next firing pulse will be applied, via now closed connect switch 64 to the lead-in wires of the fifth flashlamp 15, thereupon causing the lamp to flash. Since this lamp is the last lamp in the active circuit, it does not matter whether its lead-in wires are an open or closed circuit after flashing. When the flash unit is turned around and the other connector tab 16′ attached to the camera socket, the group 18 of lamps that then becomes uppermost and farthest away from the lens axis will be in the active circuit and will be flashed in the same manner as has been described. In a preferred embodiment, the lamps 11, etc., are high voltage types requiring about 2000 volts, for example, at low current for flashing, and they can be fired by impacting or stressing a piezoelectric element in the camera.

In summary, the above-described circuit design allows the placement of ten lamps in a space where only eight lamps could be placed before with a minimum increase in the probability of failure. In other words, the probability of failure of the circuit of FIG. 3 is less than it would be if all four normally open switches 61–64 were in the series.

Although the invention has been described with respect to specific embodiments, it will be appreciated that modifications and changes may be made by changes in the art without departing from the true spirit and scope of the invention. For example, the principles of the invention may be applied to various numbers of lamps intended to be fired sequentially from a pair of input terminals and is not limited to the illustrated five-lamp array. Thus, the circuit combination may be generalized for application to an array of n flashlamps connected in a sequencing circuit including n−1 normally open switches and n−1 normally closed switches. Each of the normally closed switches is connected in series with a respective one of the first through (n−1)th lamps. A first one of the lamps is connected directly across the input terminals, and a first one of the normally open switches is series connected with a second one of the lamps across the input terminals, that first normally open switch being associated with the first lamp. The second through (n−1)th of the normally open switches are series-connected in that order with the nth one of the lamps across the input terminals and parallel-connected with the series connection of the first normally open switch and the second lamp. The third through (n−1)th of the lamps are each series connected with a respective one of the second through (n−2)th of the normally open switches, the second through (n−1)th switches being associated with the second through (n−1)th lamps, respectively. Further, if internal lamp structure permits, it is apparent that the invention is also applicable to sequencing circuits which employ the n−1 normally open connect switches but do not use external normally closed disconnect switches, such as 71–74.

What I claim is:

1. A multilamp photoflash unit having a pair of input terminals adapted for connection to a source of firing pulses, and n flashlamps and n−1 normally open switches connected in a circuit combination across said input terminals for providing sequential flashing of said lamps in response to successively applied firing pulses, each of said normally open switches being responsive to the flashing of an associated lamp to form a closed circuit connection, and each of said lamps being connected in common to one of said input terminals, wherein the improvement comprises a circuit combination in which a first one of said lamps is connected directly across said input terminals, a first one of said normally open switches in series-connected with a second one of said lamps across said input terminals, said first switch being associated with said first lamp, the second through (n−1)th of said normally open switches are series-connected in that order with the nth one of said lamps across said input terminals and parallel-connected with the series connection of said first normally open switch and said second lamp, and the third through (n−1)th of said lamps are each series-connected with a respective one of the second through (n−2)th of said normally open switches, said second through (n−1)th switches being associated with said second through (n−1)th lamps, respectively.

2. The photoflash unit of claim 1 wherein the circuit combination further includes n−1 normally closed switches each connected in series with a respective one of said first through (n−1)th lamps, each of said normally closed switches being responsive to the flashing of the lamp with which it is series-connected to form an open circuit.

3. The photoflash unit of claim 1 further including a printed circuit board on which said circuit combination is mounted, said circuit board having conductor runs thereon, and wherein each of said normally open switches comprises a composition disposed on said circuit board and bridging a respective gap in the conductor runs thereon, said composition initially having a high resistance and converting to a conductive state upon being activated by the radiation of a proximate lamp when flashed.

4. The photoflash unit of claim 3 wherein said switch composition comprises a silver compound and a binder.

5. The photoflash unit of claim 4 wherein the circuit combination further includes n−1 normally closed switches each connected in series with a respective one of said first through n−1 lamps, each of said normally closed switches comprising a length of electrically conductive heat shrinkable material positioned so as to be in operative relationship with the radiant output of the lamp with which it is series connected when said lamp is flashed, said heat shrinkable material being attached to said circuit board at both ends of said length thereof and bridging a respective spacing in the conductor runs thereon, the midportion of said length of heat shrinkable material being spatially suspended to avoid contact with said circuit board.

6. The photoflash unit of claim 1 wherein n=5.

* * * * *